United States Patent
Yan et al.

(10) Patent No.: US 10,332,739 B2
(45) Date of Patent: Jun. 25, 2019

(54) UV RADIATION SYSTEM AND METHOD FOR ARSENIC OUTGASSING CONTROL IN SUB 7NM CMOS FABRICATION

(71) Applicant: Applied Materials, Inc., Santa Clara, CA (US)

(72) Inventors: Chun Yan, San Jose, CA (US); Xinyu Bao, Fremont, CA (US); Hua Chung, San Jose, CA (US); Schubert S. Chu, San Francisco, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/417,466

(22) Filed: Jan. 27, 2017

(65) Prior Publication Data

US 2018/0082835 A1  Mar. 22, 2018

Related U.S. Application Data

(60) Provisional application No. 62/395,931, filed on Sep. 16, 2016.

(51) Int. Cl.

| H01L 21/02 | (2006.01) |
|---|---|
| B08B 7/00 | (2006.01) |
| H01L 21/3065 | (2006.01) |
| H01L 21/324 | (2006.01) |
| H01L 21/67 | (2006.01) |
| C23C 16/44 | (2006.01) |
| C23C 16/56 | (2006.01) |

(52) U.S. Cl.
CPC ...... *H01L 21/02046* (2013.01); *B08B 7/0035* (2013.01); *B08B 7/0057* (2013.01);
(Continued)

(58) Field of Classification Search
CPC ........... H01L 21/0223; H01L 21/02233; H01L 21/02236; H01L 21/02241;
(Continued)

(56) References Cited

U.S. PATENT DOCUMENTS

| 6,168,961 B1 * | 1/2001 | Vaccari | G01R 27/2605 257/E21.531 |
| 6,511,921 B1 * | 1/2003 | Panczyk | H01L 21/02238 257/E21.285 |

(Continued)

FOREIGN PATENT DOCUMENTS

KR  100827476 B1  5/2008

OTHER PUBLICATIONS

International Search Report and Written Opinion dated Jun. 16, 2017 for Application No. PCT/US2017/015276.

*Primary Examiner* — Thanh Y. Tran
(74) *Attorney, Agent, or Firm* — Patterson + Sheridan LLP

(57) ABSTRACT

Implementations disclosed herein relate to methods for controlling substrate outgassing of hazardous gasses after an epitaxial process. In one implementation, the method includes providing a substrate comprising an epitaxial layer into a transfer chamber, wherein the transfer chamber has an ultraviolet (UV) lamp module disposed adjacent to a top ceiling of the transfer chamber, flowing an oxygen-containing gas into the transfer chamber through a gas line of the transfer chamber, flowing a non-reactive gas into the transfer chamber through the gas line of the transfer chamber, activating the UV lamp module to oxidize residues or species on a surface of the substrate to form an outgassing barrier layer on the surface of the substrate, ceasing the flow of the oxygen-containing gas and the nitrogen-containing gas into the transfer chamber, pumping the transfer chamber, and deactivating the UV lamp module.

20 Claims, 3 Drawing Sheets

(52) U.S. Cl.
CPC .......... *C23C 16/4401* (2013.01); *C23C 16/56* (2013.01); *H01L 21/3065* (2013.01); *H01L 21/324* (2013.01); *H01L 21/67017* (2013.01); *H01L 21/67034* (2013.01); *H01L 21/67069* (2013.01); *H01L 21/67115* (2013.01); *H01L 21/02532* (2013.01); *H01L 21/02576* (2013.01); *H01L 21/02664* (2013.01)

(58) Field of Classification Search
CPC ......... H01L 21/02252; H01L 21/02255; H01L 21/02263; H01L 21/02323; H01L 21/02329; H01L 21/02348
See application file for complete search history.

(56) References Cited

U.S. PATENT DOCUMENTS

| | | |
|---|---|---|
| 7,663,121 B2 | 2/2010 | Nowak et al. |
| 7,935,940 B1 | 5/2011 | Smargiassi |
| 8,584,612 B2 | 11/2013 | Hart et al. |
| 2010/0255667 A1* | 10/2010 | Seino ................ H01J 37/32091 438/585 |
| 2011/0146705 A1 | 6/2011 | Hart et al. |
| 2011/0198509 A1 | 8/2011 | Gostein et al. |
| 2013/0149462 A1 | 6/2013 | Liang et al. |
| 2014/0080324 A1* | 3/2014 | Shrinivasan .......... C23C 16/345 438/795 |
| 2014/0116335 A1 | 5/2014 | Tsuji et al. |
| 2015/0099350 A1 | 4/2015 | Srinivasan et al. |
| 2015/0249024 A1* | 9/2015 | Chen ................ H01L 21/67028 156/345.5 |

* cited by examiner

UV RADIATION SYSTEM AND METHOD FOR ARSENIC OUTGASSING CONTROL IN SUB 7NM CMOS FABRICATION

CROSS-REFERENCE TO RELATED APPLICATIONS

This application claims priority to U.S. provisional patent application Ser. No. 62/395,931, filed Sep. 16, 2016, which is herein incorporated by reference.

BACKGROUND

Field

Implementations of the present disclosure generally relate to the fabrication of integrated circuits. More specifically, implementations disclosed herein relate to apparatuses and methods for controlling substrate outgassing.

Description of the Related Art

Ion implementation is a method for the introduction of chemical impurities in semiconductor substrates to form the p-n junctions necessary for field effect or bipolar transistor fabrication. Such impurities include P-type dopants, such as boron, aluminum, gallium, beryllium, magnesium, and zinc, and N-type dopants such as phosphorus, arsenic, antimony, bismuth, selenium, and tellurium. Ion implantation of chemical impurities disrupts the crystallinity of the semiconductor substrate over the range of the implant. At low energies, relatively little damage occurs to the substrate. However, the implanted dopants will not come to rest on electrically active sites in the substrate. Therefore, annealing of the substrate is required to restore the crystallinity of the substrate and drive the implanted dopants onto electrically active crystal sites.

During the processing of the substrate in, for example, an RTP chamber, the substrate may tend to outgas impurities implanted therein. These outgassed impurities may be the dopant material, a material derived from the dopant material, or any other material that may escape the substrate during the annealing process, such as the sublimation of silicon. The outgassed impurities may deposit on the colder walls and on the reflector plate of the chamber. This deposition may interfere with temperature pyrometer readings and with the radiation distribution fields on the substrate, which in turn affects the temperature at which the substrate is annealed. Deposition of the outgassed impurities may also cause unwanted particles on the substrates and may also generate slip lines on the substrate. Depending on the chemical composition of the deposits, the chamber is taken offline for a wet clean process.

Furthermore, one of the biggest challenges relates to arsenic outgassing from substrates after arsenic doped silicon processes (Si:As). In such arsenic doped silicon processes the arsenic outgassing from the substrates is higher than the arsenic outgassing from substrates after a III-V epitaxial growth process and/or an etch clean process (e.g., a CMOS, FinFET, TFET process). Previous cycle purge approaches developed for III-V epitaxial growth process and/or etch clean processes are not effective for Si:As processed substrates. Testing has been performed on the prior known III-V methods, apparatus, and results indicate that outgassing levels are not altered after ten cycles of pump/purge, as arsenic outgassing was still detected at about 2.0 parts per billion.

Absolute zero parts per billion (ppb) outgassing is typically desired for arsenic residuals due to arsenic toxicity. To minimize toxicity from arsenic outgassing during subsequent handling and processing of substrates, there is a need for an improved method and apparatus for controlling substrate outgassing for Si:As processed substrates.

SUMMARY

Implementations disclosed herein relate to methods for controlling substrate outgassing of hazardous gasses after an epitaxial process. In one implementation, the method includes providing a substrate comprising an epitaxial layer into a transfer chamber, wherein the transfer chamber has an ultraviolet (UV) lamp module disposed adjacent to a top ceiling of the transfer chamber, flowing an oxygen-containing gas into the transfer chamber through a gas line of the transfer chamber, flowing a non-reactive gas into the transfer chamber through the gas line of the transfer chamber, activating the UV lamp module to oxidize residues or species on a surface of the substrate to form an outgassing barrier layer on the surface of the substrate, ceasing the flow of the oxygen-containing gas and the nitrogen-containing gas into the transfer chamber, pumping the transfer chamber, and deactivating the UV lamp module.

In another implementation, the method includes providing a substrate comprising an epitaxial layer into a transfer chamber having a plurality of UV lamps, flowing an oxygen-containing gas and a non-reactive gas into the transfer chamber through a gas line of the transfer chamber, activating the UV lamp module to oxidize a surface of the substrate to form an outgassing barrier layer on the surface of the substrate, ceasing the flow of the oxygen-containing gas and the nitrogen-containing gas, pumping the transfer chamber, and deactivating the UV lamp module.

In yet another implementation, a transfer chamber for transferring substrates is provided. The transfer chamber includes a top ceiling and a chamber wall defining a processing volume therein, a substrate support disposed within the processing volume, a quartz window disposed at the top ceiling, a UV lamp module disposed above the quartz window, wherein the UV lamp comprises a plurality of UV lamps, and each of the UV lamps has a half-spherical reflector disposed above the UV lamp to direct UV radiation to the substrate support, a cooling fan disposed above the UV lamp module, a vacuum pump coupled to the chamber wall through an exhaust port, and a gas source in fluid communication with the chamber wall through a gas line.

BRIEF DESCRIPTION OF THE DRAWINGS

So that the manner in which the above recited features of the disclosure can be understood in detail, a more particular description of the disclosure, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

Figure 1:
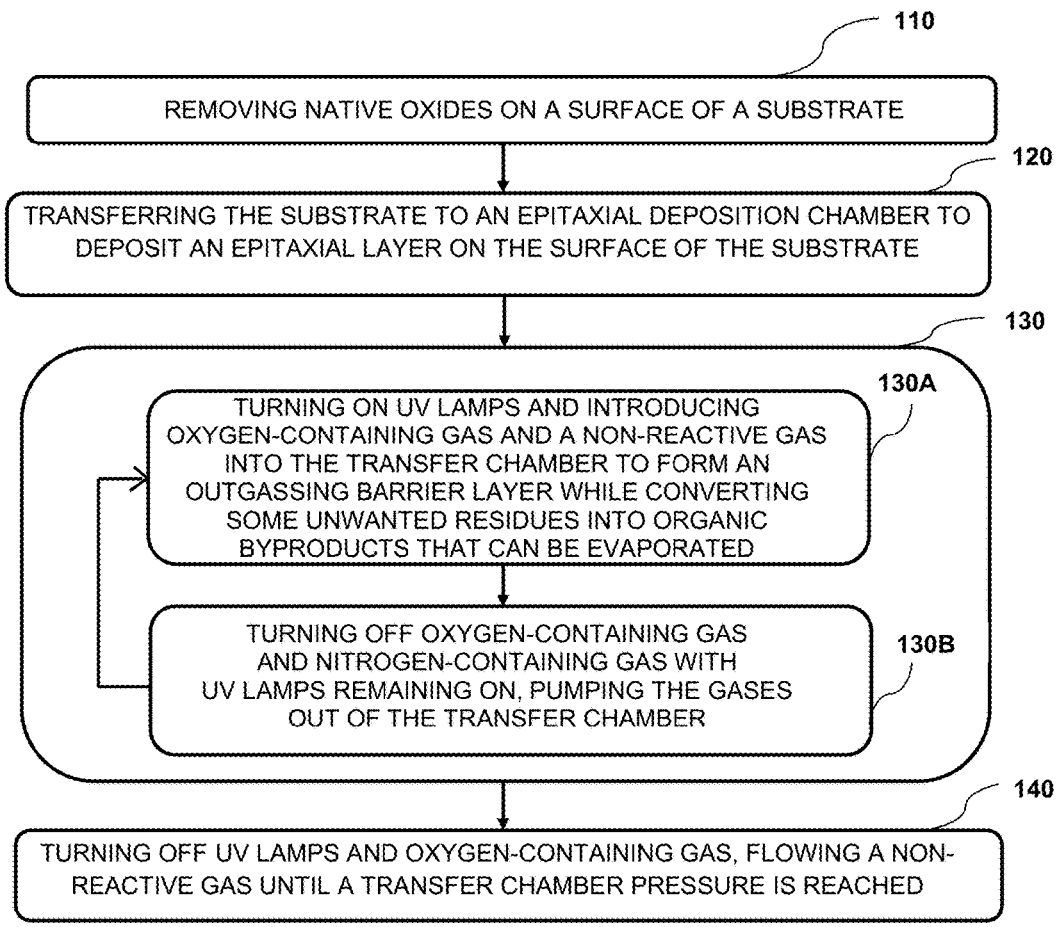
FIG. 1 is a schematic flow diagram of a method for controlling outgassing of a substrate.

To facilitate understanding, identical reference numerals have been used, where possible, to designate identical elements that are common to the figures. It is contemplated that elements disclosed in one implementation may be beneficially utilized on other implementations without specific recitation.

DETAILED DESCRIPTION

FIG. 1 is a schematic flow diagram of a method 100 for controlling outgassing of a substrate. The method 100 provides operations for reducing outgassing. Substrate outgassing generally relates to the releasing of a gas or vapor product from the substrate or from a surface of the substrate. Controlling outgassing relates to reducing and/or eliminating residual outgassed materials, for example, arsenic, from a substrate prior to transferring the substrate for downstream processing.

A "substrate" or "substrate surface," as described herein, generally refers to any substrate surface upon which processing is performed. For example, a substrate surface may include silicon, silicon oxide, doped silicon, silicon germanium, germanium, gallium arsenide, glass, sapphire, and any other materials, such as metals, metal nitrides, metal alloys, and other conductive or semi-conductive materials, depending on the application. A substrate or substrate surface may also include dielectric materials such as silicon dioxide, silicon nitride, organosilicates, and carbon doped silicon oxide or nitride materials. The term "substrate" may further include the term "wafer." The substrate itself is not limited to any particular size or shape. Although the implementations described herein are generally made with reference to a round substrate, other shapes, such as polygonal, squared, rectangular, curved, or otherwise non-circular workpieces may be utilized according to the implementations described herein.

At operation 110, a substrate is delivered into a cleaning chamber where a cleaning process is performed to remove native oxides from a surface of the substrate. Suitable cleaning processes include sputter etch processes, plasma-based oxide etch processes, or combinations thereof. Exemplary plasma-based oxide etch processes include inductively coupled plasma processes. In one implementation, the cleaning process is a plasma-based oxide etch process. The plasma-based oxide etch process may involve the simultaneous exposure of the substrate to the plasma effluents of a fluorine-containing precursor and a heavy inert precursor while applying a bias to the substrate. The plasma-based oxide etch process may be a capacitively coupled plasma process or an inductively couple plasma process. The plasma may be formed either in-situ or remotely.

In one implementation, the plasma-based oxide etch process includes introducing a flow of nitrogen trifluoride ($NF_3$) into a processing region of the cleaning chamber. Other sources of fluorine may augment or replace the nitrogen trifluoride. In general, a fluorine-containing precursor may be flowed into the processing region and the fluorine-containing precursor comprises at least one precursor selected from the group consisting of diatomic fluorine ($F_2$), monatomic fluorine (F), nitrogen trifluoride ($NF_3$), nitrogen pentafluoride ($NF_5$), sulfur hexafluoride ($SF_6$), xenon difluoride ($XeF_2$), carbon tetrafluoride ($CF_4$), octafluorocyclobutane ($C_4F_8$), trifluoromethane ($CHF_3$), hydrogen fluoride (HF), and combinations thereof.

The plasma-based oxide etch process further includes introducing a flow of a relatively heavy inert precursor into the processing region where it is simultaneously excited in a plasma along with the nitrogen trifluoride. The inert precursor may be a heavy inert precursor. As described herein, heavy inert precursors include argon (Ar), krypton (Kr), xenon (Xe), and combinations thereof.

At operation 120, once the oxides have been removed from the surface of the substrate, the substrate is transferred, through a first transfer chamber, to an epitaxial deposition chamber to deposit an epitaxial layer on the surface of the substrate. Any suitable epitaxial deposition process may be performed in the epitaxial deposition chamber. Since the surface of the substrate is contaminant free due to the cleaning process of operation 110, the quality of the epitaxial layer subsequently formed on the surface of the substrate is improved. The epitaxial deposition may be a selective epitaxial deposition process. The epitaxial layer may be doped or undoped group IV-containing material such as Si, Ge, Si:P, SiGe, SiC, SiAs, SiGe:B, Si:CP, any suitable semiconductor materials or compound semiconductor materials such as group III-V semiconductor compound materials. In one implementation, the epitaxial layer is an n-type doped silicon layer, for example a silicon layer doped with arsenic (Si:As) or a silicon layer doped with phosphorus (Si:P). In another implementation, the epitaxial layer is an n-type doped germanium layer, for example a germanium layer doped with arsenic.

In one implementation, the epitaxial layer is deposited using a high temperature chemical vapor deposition (CVD) process. In this thermal-CVD process, processing gases such as dichlorosilane, silane, disilane, germane, phosphorus-containing gas, arsenic-containing gas, hydrogen chloride, or combinations thereof are used to deposit the epitaxial layer.

Optionally, a Group III-V etch process may be performed after epitaxial deposition process and prior to transferring to the second transfer chamber to be discussed below. Alternatively, the epitaxial deposition process may be replaced by the Group III-V etch process, depending on the application.

At operation 130, once the epitaxial layer has been formed on the surface of the substrate, the substrate is transferred to a second transfer chamber in an ambient nitrogen environment for cooling down the substrate. The ambient nitrogen environment may be achieved by introducing a nitrogen-containing gas into the second transfer chamber having a pressure maintained at a transfer pressure of about 60 Torr to about 120 Torr, for example about 80 Torr. Suitable nitrogen-containing gas may include, but is not limited to, ammonia ($NH_3$), nitrogen ($N_2$), hydrazine ($N_2H_4$), and mixtures thereof. In some embodiments, the nitrogen-containing gas may include a gas mixture comprising $NH_3$ and $N_2$ or a gas mixture comprising $NH_3$ and $H_2$. In certain embodiments, hydrazine ($N_2H_4$) may be used in place of or in combination with $NH_3$ in the gas mixture with $N_2$ and $H_2$. In some embodiments, the nitrogen-containing gas may use nitric oxide (NO), nitrous oxide ($N_2O$), or nitrogen dioxide ($NO_2$). The flow of the nitrogen-containing gas may be deactivated once the desired nitrogen concentration level is reached, or may be remained on for the subsequent UV activation process 130A.

As will be discussed in further detail below with respect to FIG. 2, the second transfer chamber is an improved cooldown chamber having an ultraviolet (UV) lamp module disposed adjacent to a top ceiling of the chamber for controlling outgassing after the epitaxial process. It should be appreciated that the operation 130 may be performed by the transfer chamber 200 shown in FIG. 2 or any other transfer chamber function similarly or equally to the transfer chamber 200.

The operation 130 generally includes an UV activation process 130A and a pump process 130B. The UV activation process 130A and the pump process 130B may be alternatingly performed to form an outgassing barrier layer while removing unwanted species that are loosely bonded on the surface of the substrate. For example, if a silicon layer doped with arsenic (Si:As) is formed on the surface of the substrate during the epitaxial process, arsenic may be outgassed and trapped on the surface of the substrate. These arsenic-containing species are oxidized by the UV activation process 130A to form arsenic oxides that serve as a barrier layer for preventing outgassing of arsenic. At the same time, those loosely bonded arsenic-containing species are partially desorbed and converted to high vapor pressure byproducts due to the oxidation of the substrate surface, which are then pumped out of the second transfer chamber during the pump process 130B. The UV activation process 130A and the pump process 130B may be repeated until outgassing of toxic species, for example, arsenic, is undetectable.

During the UV activation process 130A, the UV lamps or bulbs are activated, and an oxygen-containing gas and a non-reactive gas (e.g., a nitrogen-containing gas) are introduced into the second transfer chamber. The UV lamps may be activated before, during, or after flowing of the oxygen-containing gas and the nitrogen-containing gas into the second transfer chamber. The UV radiation dissociates the oxygen-containing gas into $O_2$ or O radicals which oxidize the arsenic-containing species as well as silicon or III-V surface (if present) to form an outgassing barrier layer on the surface of the substrate. The UV radiation also breaks the loose bonds between the unwanted species and the surface of the substrate and/or reacts with the arsenic species or residuals to convert them into organic byproducts that can be evaporated quickly and removed out of the second transfer chamber during the pump process 130B. By "UV radiation" is meant radiation having a wavelength generally in the range of 100 nm to 400 nm.

In some implementations, the flow of the non-reactive gas is ceased and the substrate is exposed only to the oxygen-containing gas during the UV activation process 130A.

Suitable oxygen-containing gas may include oxygen ($O_2$), ozone ($O_3$) gas, nitrous oxide ($N_2O$), nitrogen monoxide, (NO), carbon monoxide (CO), carbon dioxide ($CO_2$), water vapor ($H_2O$), or any combination thereof. The nitrogen-containing gas introduced during the UV activation process 130A may or may not be the same as the nitrogen-containing gas used to create ambient nitrogen environment in the previous step.

The wavelength of the UV lamps may be selected to activate or dissociate the oxygen-containing gas. For example, the oxygen-containing gas may be exposed to UV radiation at a range of between about 10 nm and about 500 nm, for example between about 190 nm and 365 nm, such as, 193 nm, for example 248 nm, for example 266 nm, for example 290 nm, for example 355 nm, for example 365 nm, or example 420 nm. If oxygen is used during the UV activation process 130A, the wavelength between about 190 nm and about 266 nm may be used because oxygen absorbs the 184.9 nm wavelength. If ozone is used during the UV activation process 130A, the wavelength between 266 nm and about 290 nm may be used because ozone absorbs the 253.7 nm wavelength. In some implementations, the UV lamps may emit two different wavelengths to enhance dissociation of the gases, species or residues. For example, a first set of UV lamps are configured to emit a first UV radiation of about 240 nm and a second set of UV lamps are configured to emit a second UV radiation of about 355 nm. The UV radiation may be delivered at intensity between 0.05 and 5 $W/cm^2$.

The UV activation process 130A may be performed for about 5 seconds to about 45 seconds, for example about 10 seconds to about 30 seconds. The chamber pressure may be maintained at a transfer pressure of about 80 Torr.

During the pump process 130B, flowing of the oxygen-containing gas and the nitrogen-containing gas are deactivated, and the oxygen-containing gas and the nitrogen-containing gas are pumped out of the second transfer chamber. The UV lamps may remain on or be deactivated. A non-reactive gas, such as a nitrogen-containing gas, may be used to purge the transfer chamber before pumping. In some implementations, the UV lamps remain on during the pump process 130B. The chamber pressure is reduced from the transfer pressure (e.g., 80 Torr) to a lower pressure of about 0.5 Torr to about 20 Torr, for example about 1 Torr. The pump process 130B may be performed for about 10 seconds to about 40 seconds, such as about 15 seconds to about 30 seconds, for example about 20 seconds.

Once the oxygen-containing gas and the nitrogen-containing gas have been pumped out of the second transfer chamber, the UV activation process 130A described above may be repeated. For example, flowing of the oxygen-containing gas and the nitrogen-containing gas are resumed and the UV lamps or bulbs are activated (if previously deactivated) to dissociate the oxygen-containing gas into $O_2$ or O radicals which again oxidize the arsenic-containing species to form an outgassing barrier layer on the surface of the substrate while breaking the loose bonds between the unwanted species and the surface of the substrate and/or reacting with the arsenic species or residuals to convert them into organic byproducts that can be evaporated quickly and removed out of the second transfer chamber during the pump process 130B. The chamber pressure is ramped up back to about 60 Torr to about 120 Torr, for example about 80 Torr. The UV activation process 130A may be performed for about 5 seconds to about 45 seconds, for example about 10 seconds to about 30 seconds. In some implementations, the oxygen-containing gas and the nitrogen-containing gas may be different from the oxygen-containing gas and the nitrogen-containing gas used in the previous UV activation process.

Thereafter, the pump process 130B described above may be repeated. For example, flowing of the oxygen-containing gas and the nitrogen-containing gas are deactivated, with or without the UV lamps activated, and the oxygen-containing gas and the nitrogen-containing gas are pumped out of the second transfer chamber. The chamber pressure is again reduced from the transfer pressure (e.g., 80 Torr) to a lower pressure of about 0.5 Torr to about 20 Torr, for example about 1 Torr. The pump process 130B may be performed for about 10 seconds to about 40 seconds, such as about 15 seconds to about 30 seconds, for example about 20 seconds.

The UV activation process 130A and the pump process 130B may be repeated about 2 cycles, 3 cycles, 4 cycles, 5 cycles, 6 cycles, 7 cycles, 8 cycles, 9 cycles, 10 cycles, or any desired number of times until outgassing of toxic species, for example, arsenic, is undetectable. In one implementation, the UV activation process 130A and the pump process 130B are repeated for about 2 to 5 cycles, about 5 to 10 cycles, about 10 to 15 cycles, or about 15 to 20 cycles. No outgassing residues have been observed after operation 130.

At operation 140, once the unwanted species have been removed from the substrate surface (i.e., no detectable outgassing of toxic species), the UV lamps are deactivated and flowing of the oxygen-containing gas is deactivated. The nitrogen-containing gas may continue flowing or may be resumed (if previously deactivated) or a non-reactive gas such as nitrogen gas may be flowed into the second transfer chamber until the pressure of the second transfer chamber is reached to the transfer pressure (e.g., 80 Torr). In one implementation, the nitrogen-containing gas is flowed into the second transfer chamber for about 20 seconds or less, for example about 15 seconds or less, for example 12 seconds or less, such as about 5 seconds to about 10 seconds. Other non-reactive gas may also be used alternatively or in addition to the nitrogen-containing gas.

Once the desired transfer pressure is reached within the second transfer chamber, the substrate may be transferred to a substrate access chamber. The substrate access chamber may be a load-lock chamber and/or a FOUP (front opening unified pod). In one implementation, after outgassing has been reduced at operation 130, the substrate is transferred to the FOUP for further down-stream processing.

Figure 2:
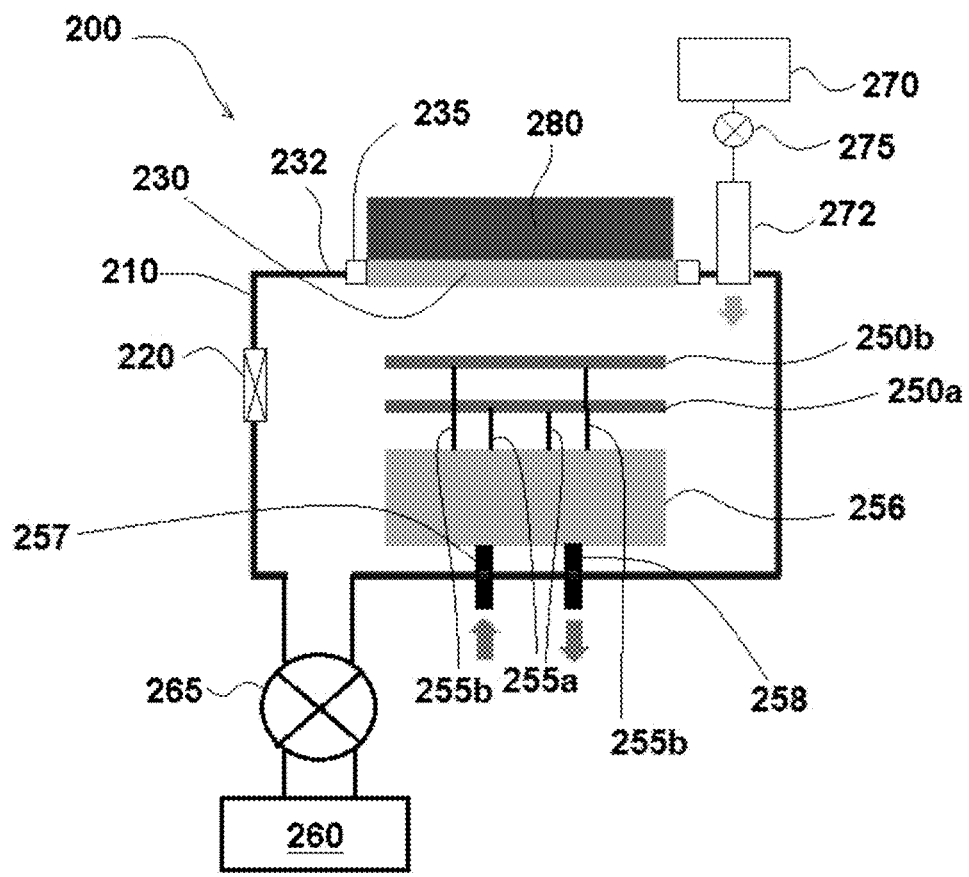
FIG. 2 schematically illustrates a simplified side cross-sectional view of a transfer chamber according to implementations of the present disclosure.

FIG. 2 schematically illustrates a simplified side cross-sectional view of a transfer chamber 200 according to implementations of the present disclosure. The transfer chamber may be used to perform the operation 130, such as the UV activation process 130A and the pump process 130B discussed above with respect to FIG. 1. The transfer chamber 200 comprises a chamber wall 210, which may be made of a metallic material such as aluminum. The chamber wall 210 defines a processing volume therein. A quartz window 230 is clamped to a top ceiling 232 of the chamber wall 210. The quartz window 230 may be made of synthetic quartz for its high transmission of UV light. A continuous O-ring 235 may be disposed between the quartz window 230 and the chamber wall 210 to provide a vacuum seal. A UV lamp module 280 may be disposed above the quartz window 230, with or without a gap between the UV lamp module 280 and the quartz window 230. A vacuum pump 260 is connected to the transfer chamber 200 through an exhaust port which can be closed by a valve 265. The vacuum pump 260 evacuates the transfer chamber 200 to a certain vacuum level suitable for the pump process 230B discussed above. A gas source 270, which may include an oxygen-containing gas source and a nitrogen-containing gas source as discussed above with respect to FIG. 1, is connected to the transfer chamber 200 through a gas line 272, which can be closed by a gas valve 275.

While a single gas line 272 is shown, it is contemplated that two or more gas lines may be adapted for flowing of same or different gases. In some implementations, two gas lines may be disposed at the top ceiling 232 of the transfer chamber 200. Additionally or alternatively, one or more gas lines may be disposed at the sidewall of the transfer chamber 200. Each of the gas lines may be configured to flow one or more processing gases as discussed above at operation 130.

The quartz window 230 is configured to be mounted on the top ceiling 232 of the transfer chamber 200 in which UV light from the UV lamp module 280 is transmitted through the quartz window 230 while a gas such as an oxygen-containing gas and a nitrogen-containing gas is flowed into the transfer chamber 200 to perform processes, such as the UV activation process 130A discussed above at operation 130.

A plurality of substrates, for example two substrates 250a, 250b, may be lifted and supported respectively by a plurality of substrate support pins 255a, 255b extending upwardly from the substrate support 156. The temperature of the substrate support 256 may be adjusted by circulating a cooling fluid or a cooling gas from an inlet 257 through the substrate support 256 to an outlet 258.

In operation, the substrate, for example substrates 150a, 150b are transferred through a loading port 220 in the chamber wall 210 and placed on the substrate support pins 255a, 255b, respectively. The transfer chamber 200 may be evacuated by the vacuum pump 260 to reach the transfer chamber before the substrates are loaded into the transfer chamber 200. During the UV activation process 130A, the UV lamp module 280 is activated, and an oxygen-containing gas and a nitrogen-containing gas from the gas source 270 are introduced into the transfer chamber 200 through the gas line 272. The UV lamp module 280 may be activated before, during, or after flowing of the oxygen-containing gas and the nitrogen-containing gas into the transfer chamber 200. The UV lamp module 280 irradiates the substrates 250a, 250b through the quartz window 230 with UV radiation at a wavelength of 240 nm and intensity between 0.05 and 5 W/cm$^2$, for about 10 seconds to about 30 seconds. The oxygen-containing gas absorbs UV radiation and decomposes into O or $O_2$ radicals which react with the unwanted residue, for example arsenic-containing species, to form arsenic oxides on the surface of the substrate. As discussed previously, the arsenic oxides serve as a barrier for outgassing control. Some of the unwanted residues or species are converted into organic byproducts that can be evaporated quickly. At the same time, the O or $O_2$ radicals also break the loose bonds between the unwanted species and the surface of the substrate, thereby removing arsenic-containing species ($AsH_x$, TBA) absorbed or trapped on the surface of the substrate 250a, 250b. The reaction products are gaseous and can be evacuated from the transfer chamber 200 by the vacuum pump 260, as the pump process 130B discussed above with respect to FIG. 1.

Figure 3:
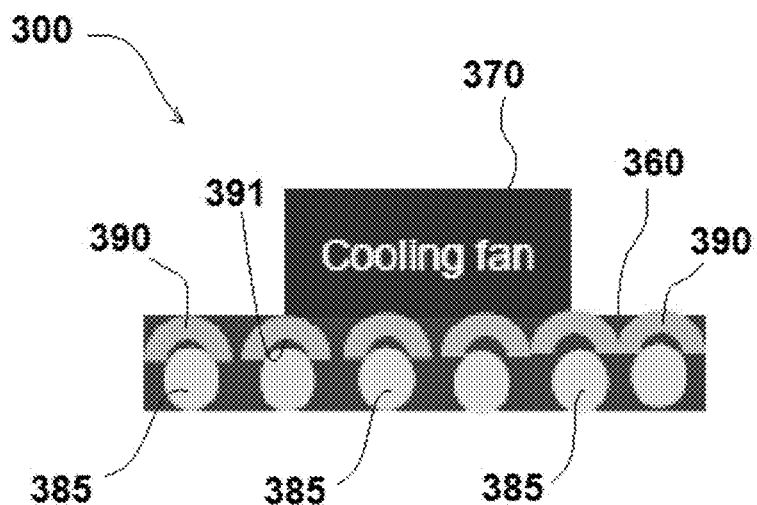
FIG. 3 illustrates a cross-sectional schematic view of a portion of a UV lamp module in accordance with one implementation of the present disclosure.

The UV lamp module 280 may have different configurations to enhance efficiency of the oxidation process. FIG. 3 illustrates a cross-sectional schematic view of a portion of a UV lamp module 300 in accordance with one implementation of the present disclosure. The UV lamp module 300 may be used in place of the UV lamp module 280. The UV lamp module 300 generally includes a housing 360 for holding a plurality of UV lamps 385 therein. The UV lamps 385 can be arranged parallel with each other and sized to cover substantially the entire area of the quartz window 230 (FIG. 2) to achieve uniform UV radiation intensity above the substrate, such as the substrates 250A, 250B in the transfer chamber 200. The UV lamps 385 may have identical or different lengths sized to overlay the quartz window 230. In one implementation, the UV lamps 385 are arranged in two columns disposed either head to head or offset from each other. In such a case, the first column of UV lamps and the second column of UV lamps may be configured co-planar. The UV lamps 385 may have a square design, while other shape such as a round shape is also contemplated.

A single hollow, half-spherical reflector 390 surrounds each UV lamp 385. Each UV lamp 385 may have a tubular shape, a dual-tubular shape or other suitable shape. The reflectors 390 are arranged above the UV lamps 385 and the UV radiation from the UV lamps 385 can pass directly through the quartz window 230 into the transfer chamber 200. The spherical or concave surface 391 of each reflector 390 reflects UV radiation downward to enhance intensity and uniformity of the UV radiation. The reflectors 390 may have a constant thickness of about 1 mm to about 5 mm to provide the needed mechanical strength. While a half-spherical reflector 390 is shown, other shapes such as oval or upside-down V shape are also contemplated.

If desired, the reflectors 390 may have a reflective coating layer or layer stack provided on the underside (i.e., facing the UV lamp 385) of the reflector 390. The reflective coating layer or layer stack is designed to reflect or direct UV radiation to the substrates. In one implementation, the reflective coating layer is a multi-layer coating having at least two materials of different refractive index, which in combination reflect radiation in the UV range of the electromagnetic spectrum. Suitable materials for the multi-layer coating may include at least one of the oxides or nitrides of aluminum, tantalum, titanium, silicon, niobium, hafnium, cerium, zirconium, yttrium, erbium, europium, gadolinium, indium, magnesium, bismuth, thorium, and combinations thereof and similarly suitable rare earth metals. In one implementation, the multi-layer coating includes a combination of at least two of the above oxides or nitrides.

A cooling fan 370 may be mounted on the upper surface of the housing 360. When powered, the cooling fan 370 will draw air from the top, through an opening (not shown) located at the bottom of the cooling fan 370 to cool the reflectors 390 within the housing 360. The cooling of the reflectors 390 cools the UV lamps 385 as well.

Figure 4:
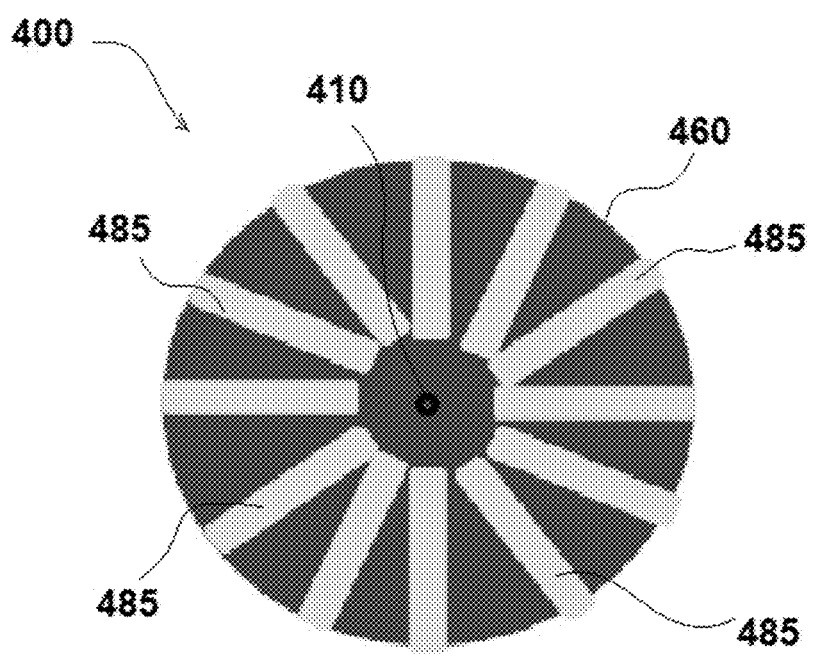
FIG. 4 illustrates a top view of a portion of a UV lamp module in accordance with another implementation of the present disclosure.

FIG. 4 illustrates a top view of a portion of a UV lamp module 400 in accordance with another implementation of the present disclosure. The UV lamp module 400 may be used in place of the UV lamp module 280. In this implementation, a plurality of UV lamps 485 are disposed or housed within a housing 460. The UV lamps 485 may have a tubular shape, a dual-tubular shape or other suitable shape. The UV lamps 485 extend radially outward (e.g., like spokes of a wheel) from a central axis 410 of the housing 460. The UV lamps 485 may be equally spaced around the outer circumference of the housing 460 to provide uniform irradiation of the substrates 250A, 250B (FIG. 2).

While not shown, a single hollow, half-spherical reflector, such as the reflector 390 discussed above, may be used to surround each UV lamp 485 to reflect or direct UV radiation to the substrates.

The UV lamps 385 and the UV lamps 485 are arranged so UV that radiation is emitted in a way such that the entire substrate surface is irradiated uniformly, while all molecules of the processing gases within the transfer chamber 200, from top to bottom and side to side, are saturated with UV radiation flux.

Testing has been completed and results indicate that after an exposure to an oxygen containing gas residual arsenic related species on the substrate and/or on the surface of the substrate, as well as on the Group III-V surface, are oxidized. The arsenic residuals are broken down to either stable oxides or byproducts which have high vapor pressure and evaporate quickly. Also, after oxidation, the non-reactive gas pump/purge cycle is completed, thus driving down outgassing to zero ppb. Results indicate that after oxidation and pump cycles, outgassing was reduced to zero ppb, thus leaving no outgassing residuals and further improving throughput.

To summarize, the implementations disclosed herein relate to methods and apparatuses for controlling substrate outgassing such that hazardous gasses are eliminated from a surface of a substrate after a Si:As process or after a Group III-V epitaxial growth process and/or after a Group III-V etch process has been performed on a substrate, and prior to additional processing. Some of the benefits of the present disclosure include flowing an oxygen containing gas to an improved transfer chamber having UV capability to oxidize arsenic related species. A non-reactive gas is then flowed into the transfer chamber to purge the transfer chamber before getting pumped out of the transfer chamber. The oxidation and pump processes are repeated until outgassing of toxic species, for example, arsenic, is undetectable. As such, hazardous gases and outgassing residuals are decreased and/or removed from the substrate such that further processing may be performed.

While the foregoing is directed to implementations of the present disclosure, other and further implementations of the disclosure may be devised without departing from the basic scope thereof, and the scope thereof is determined by the claims that follow.

What is claimed is:

1. A method of processing a substrate, comprising:
    a) positioning a substrate in an epitaxial deposition chamber;
    b) depositing an epitaxial layer over the substrate in the epitaxial deposition chamber, the epitaxial layer including a first dopant;
    c) transferring the substrate with the epitaxial layer into a transfer chamber, wherein the transfer chamber has an ultraviolet (UV) lamp module disposed adjacent to a top ceiling of the transfer chamber;
    d) flowing an oxygen-containing gas into the transfer chamber through a gas line of the transfer chamber;
    e) flowing a non-reactive gas into the transfer chamber through the gas line of the transfer chamber;
    f) activating the UV lamp module to:
        form an outgassing barrier layer on the surface of the substrate, the outgassing barrier layer comprising an oxide that includes the first dopant, and
        form a gaseous byproduct comprising the first dopant;
    g) ceasing the flow of the oxygen-containing gas and the non-reactive gas into the transfer chamber;
    h) pumping out gases and reducing pressure created after the oxidation in the transfer chamber; and
    i) deactivating the UV lamp module.

2. The method of claim 1, further comprising:
    before performing operation i), repeating operations d) through h) until a target outgassing level of the first dopant is reached.

3. The method of claim 1, further comprising:
    between ceasing the flow of the oxygen-containing gas into the transfer chamber and pumping out gases and reducing pressure created after the oxidation in the transfer chamber, flowing the non-reactive gas into the transfer chamber.

4. The method of claim 1, further comprising:
    after deactivating the UV lamp module, flowing the non-reactive gas into the transfer chamber, wherein the chamber pressure is maintained at about 80 Torr.

5. The method of claim 1, wherein the chamber pressure is maintained at about 80 Torr during activating the UV lamp module to oxidize residues or species on the surface of the substrate to form the outgassing barrier layer on the surface of the substrate.

6. The method of claim 1, wherein during pumping the transfer chamber the chamber pressure is maintained at about 1 Torr.

7. The method of claim 1, wherein the UV lamp module emits radiation having a wavelength in the range of 100 nm to 400 nm.

8. The method of claim 1, wherein activating the UV lamp module to form the outgassing barrier layer on the surface of the substrate is performed for about 10 seconds to about 30 seconds.

9. The method of claim 1, wherein pumping out gases and reducing pressure created after the oxidation in the transfer chamber is performed for about 20 seconds.

10. The method of claim 1, wherein the UV lamp module comprises a plurality of UV lamps arranged parallel with each other.

11. The method of claim 10, wherein each of the UV lamps has a half-spherical reflector disposed above the UV lamp to direct UV radiation to the substrate.

12. The method of claim 11, wherein the reflector has a reflective coating layer.

13. The method of claim 10, wherein the UV lamps are arranged in a square shape.

14. The method of claim 1, wherein the UV lamp module comprises a plurality of UV lamps disposed within a housing, and the plurality of UV lamps extend radially outward from a central axis of the housing.

15. The method of claim 1, wherein the first dopant is arsenic.

16. A method of processing a substrate, comprising:
a) positioning a substrate in an epitaxial deposition chamber;
b) depositing an epitaxial layer over the substrate in the epitaxial deposition chamber;
c) transferring the substrate with the epitaxial layer into a transfer chamber having a UV lamp module comprising a plurality of UV lamps;
d) flowing an oxygen-containing gas and a non-reactive gas into the transfer chamber through a gas line of the transfer chamber;
e) activating the UV lamp module to oxidize a surface of the substrate to form an outgassing barrier layer on the surface of the substrate, the outgassing barrier layer comprising an oxide that includes a first dopant;
f) ceasing the flow of the oxygen-containing gas and the non-reactive gas;
g) pumping out gases and reducing pressure created after the oxidation in the transfer chamber;
h) repeating operations d) through g) until a target outgassing level of the first dopant is reached; and
i) deactivating the UV lamp module.

17. The method of claim 16, wherein the first dopant is arsenic.

18. A method of processing a substrate, comprising:
positioning a substrate comprising an epitaxial layer in a transfer chamber, wherein the transfer chamber has an ultraviolet (UV) lamp module disposed adjacent to a top ceiling of the transfer chamber;
flowing an oxygen-containing gas into the transfer chamber through a gas line of the transfer chamber;
flowing a non-reactive gas into the transfer chamber through the gas line of the transfer chamber;
activating the UV lamp module to oxidize residues or species on a surface of the substrate to form an outgassing barrier layer on the surface of the substrate while the chamber pressure is at a transfer pressure of about 60 Torr to about 120 Torr, and the UV activation process is performed for about 5 seconds to about 45 seconds;
ceasing the flow of the oxygen-containing gas and the non-reactive gas into the transfer chamber while the UV lamp module remains activated;
pumping out gases and reducing pressure created after the oxidation in the transfer chamber for about 10 to about 40 seconds, wherein the pressure decreases from the transfer pressure to a lower pumped pressure of about 0.5 Torr to about 20 Torr;
deactivating the UV lamp module after pumping out the gases;
flowing the oxygen-containing gas into the transfer chamber through the gas line of the chamber;
flowing the non-reactive gas into the transfer chamber through the gas line of the transfer chamber;
reactivating the UV lamp module to oxidize residues or species on the surface of the substrate to form an outgassing barrier layer on the surface of the substrate while the chamber pressure is at the transfer pressure of about 60 Torr to about 120 Torr, and the UV activation process is performed for about 5 seconds to about 45 seconds;
ceasing the flow of the oxygen-containing gas and the non-reactive gas into the transfer chamber while the UV lamp module remains activated; and
pumping out gases and reducing pressure created after the oxidation in the transfer chamber for about 10 seconds to about 40 seconds, wherein the pressure decreases from the transfer pressure to the pumped pressure of about 0.5 Torr to about 20 Torr.

19. The method of claim 18, wherein the method is repeated until a target outgassing level of a toxic species is reached.

20. The method of claim 18, wherein UV lamps of the UV lamp module emit a plurality of different wavelengths to enhance dissociation of the gases, species, or residues.

* * * * *